(12) United States Patent
Lin

(10) Patent No.: US 9,019,026 B2
(45) Date of Patent: Apr. 28, 2015

(54) CIRCUIT AND METHOD FOR GENERATING OSCILLATING SIGNALS

(71) Applicant: STMicroelectronics (Shenzhen) R&D Co. Ltd., Shenzhen, Nanshan (CN)

(72) Inventor: Hong Wu Lin, Nanshan (CN)

(73) Assignee: STMicroelectronics (Shenzhen) R&D Co. Ltd, Shenzhen (CN)

( * ) Notice: Subject to any disclaimer, the term of this patent is extended or adjusted under 35 U.S.C. 154(b) by 0 days.

(21) Appl. No.: 14/073,198

(22) Filed: Nov. 6, 2013

(65) Prior Publication Data

US 2014/0184345 A1 Jul. 3, 2014

(30) Foreign Application Priority Data

Dec. 31, 2012 (CN) .......................... 2012 1 0596236

(51) Int. Cl.
*H03K 3/023* (2006.01)
*H03K 3/0231* (2006.01)

(52) U.S. Cl.
CPC .................................. *H03K 3/0231* (2013.01)

(58) Field of Classification Search
USPC ...................... 331/111, 143, 150, 153, 108 C
See application file for complete search history.

(56) References Cited

U.S. PATENT DOCUMENTS

| 7,940,136 B2* | 5/2011 | Tseng | 331/111 |
| 7,948,328 B2* | 5/2011 | Kim | 331/111 |
| 7,965,149 B2* | 6/2011 | Kim | 331/111 |

* cited by examiner

*Primary Examiner* — Joseph Chang
(74) *Attorney, Agent, or Firm* — Gardere Wynne Sewell LLP

(57) ABSTRACT

An oscillator module includes a first MOS transistor and a capacitor. The capacitor is coupled between a gate and source of the first MOS transistor. The drain of the first MOS transistor receives a first bias current and generates an oscillating output signal. A switching circuit operates in response to the oscillating output signal to selective charge and discharge the capacitor. A current sourcing circuit is configured to generate the bias current. The current sourcing circuit includes a second MOS transistor which has an identical layout to the first MOS transistor and receives a second bias current. A resistor is coupled between a gate and source of the second MOS transistor. The current sourcing circuit further includes a current mirror having an input configured to receive a reference current passing through the resistor and generate the first and second bias currents.

14 Claims, 7 Drawing Sheets

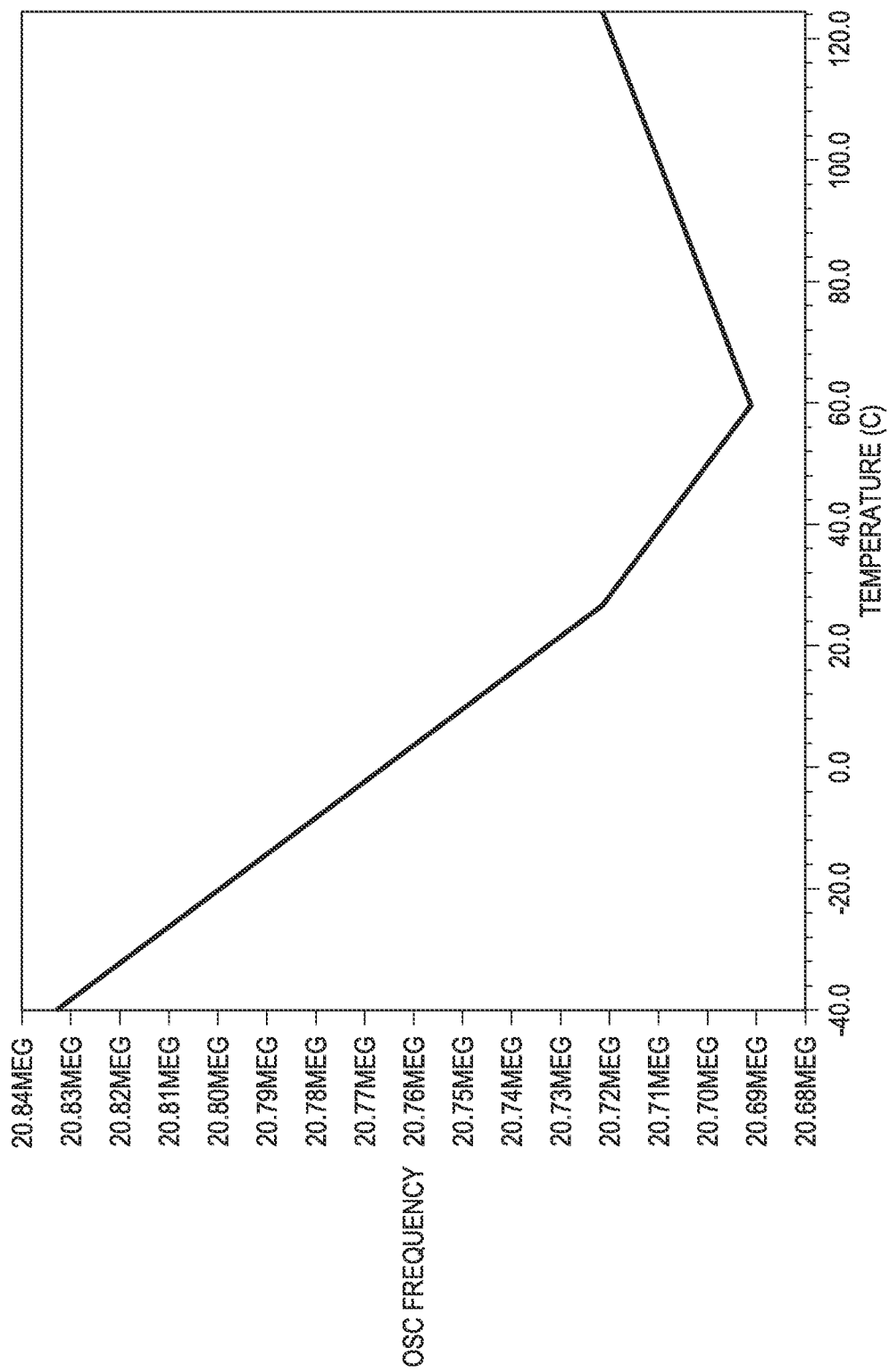

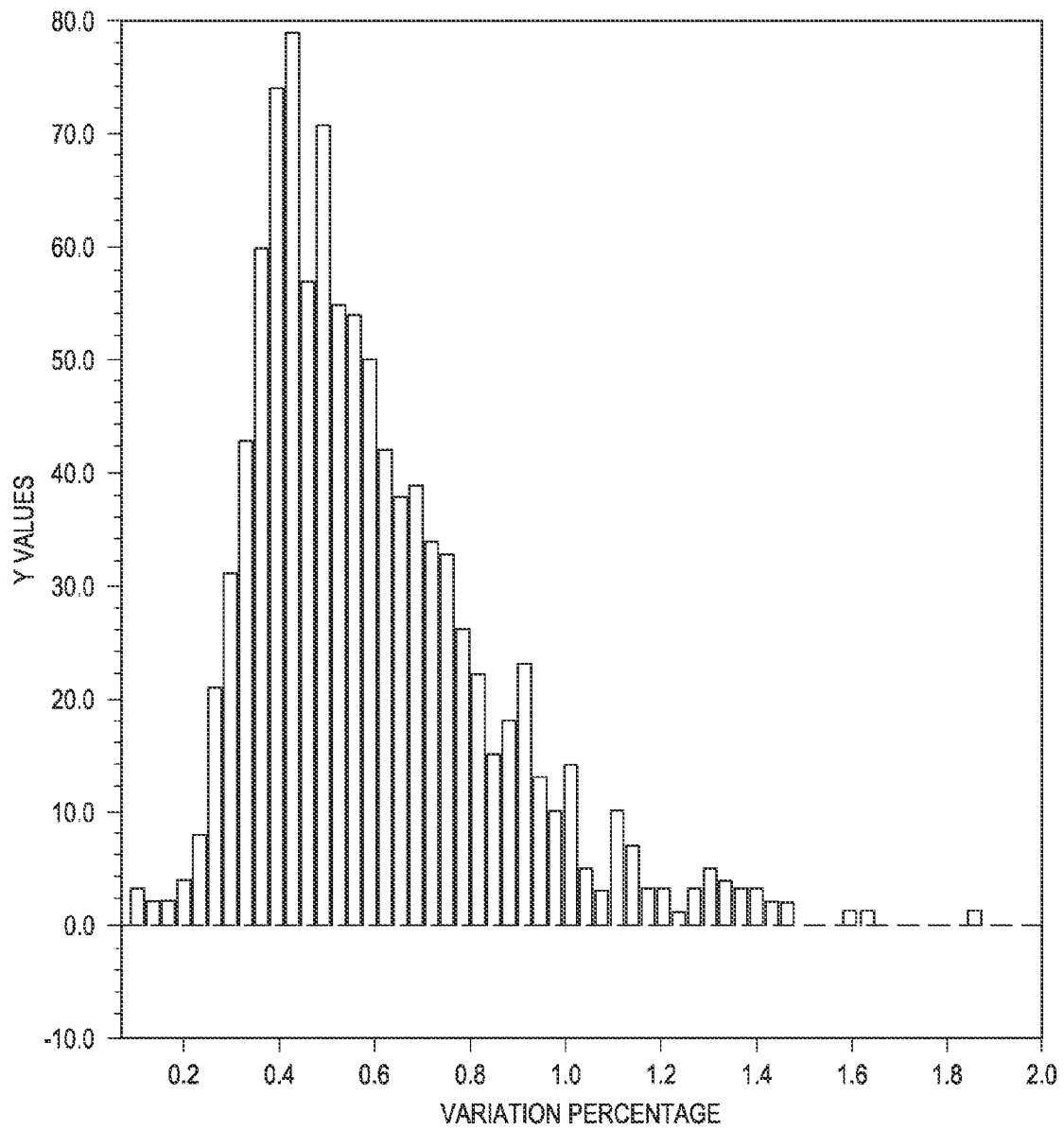

CIRCUIT AND METHOD FOR GENERATING OSCILLATING SIGNALS

PRIORITY CLAIM

This application claims priority from Chinese Application for Patent No. 201210596236.7 filed Dec. 31, 2012, the disclosure of which is incorporated by reference.

TECHNICAL FIELD

The present invention relates generally to electronic circuits, and more particularly to an oscillating circuit.

BACKGROUND

There have been several types of RC oscillator. FIGS. 1 to 4 respectively show different types of RC oscillators.

However, all these oscillators have their disadvantages especially when the oscillation frequency is set to be high (such as at around 20 MHz). The speed of the RC oscillator in FIG. 1 is limited by the speed of its comparator. The RC oscillator in FIG. 2 will be affected by the threshold variation of Schmitt trigger and the trimming will be difficult since the RC is in the oscillation loop. The oscillator in FIG. 3 is easy to be trimmed but still affected by the uncertainty of switching threshold. The RC oscillator in FIG. 4 is also hard for trimming and the nonlinearity of the capacitor will have effect on the performance.

Besides, due to the varying working conditions such as different temperatures and different supply voltages, and due to the varied semiconductor process of the transistors, the transistors can not operate very stably under all circumstance, thus the oscillators can not achieve a stable high frequency.

Thus, there is a need to have a stable oscillator despite of the varying working conditions such as temperature and varied semiconductor process. There is also a need to have an oscillator that is easy to be trimmed.

SUMMARY

In one aspect, there is provided a circuit, comprising: an oscillator module, comprising: a first MOS transistor, having a gate, a source coupled to a reference voltage, and a drain coupled to a first trigger node of the oscillator module, for generating the oscillating output signal of the oscillator module by being alternately turned on and off, and a first capacitor, coupled between the gate and the source of the first MOS transistor, and configured to be alternately charged or discharged in response to the oscillating output signal to turn the first MOS transistor on and off; and a current source, configured to control a current flowing through the first MOS transistor so that a voltage between the drain and the source of the first MOS transistor is no greater than a first value when the first MOS transistor is turned on.

In this aspect, the current source is configured to provide the first MOS transistor a proper current which enables that the voltage between the drain and the source of the first MOS transistor is no greater than a first value. Therefore the voltage of the first trigger node can be controlled despite of the varied working conditions, thus the circuit can provide a stable oscillating output.

According to a preferred embodiment, the current source comprises: a second MOS transistor (MN4), having the same layout as the first MOS transistor, a voltage control module, configured to control a voltage between a drain and a source of the second MOS transistor to be no greater than the first value when the second MOS transistor is turned on, and a current mirror having a resistor coupled between a gate and the source of the second MOS transistor, wherein the current mirror dumps a current, which is the same as a current flowing through the resistor, through the first MOS transistor.

Since the second MOS transistor has the same layout of the first MOS transistor, the working conditions and semiconductor process of the two transistors are the same. Therefore, by controlling the second MOS transistor and using the same current as that flowing through the second MOS transistor as a bias current flowing through the first MOS transistor, the first MOS transistor would be in the same state as the second MOS transistor, despite of the varied working conditions and semiconductor process.

In a further preferred embodiment, the current mirror dumps a current, which is the same as a current flowing through the resistor, to charge the first capacitor.

In this embodiment, the frequency of the oscillator module depends on the resistance of the resistor and the capacity of the first capacitor, thus the oscillator module is easy to be trimmed by adjusting the resistance of the resistor and is not affected by parasitic parameters.

In a further preferred embodiment, the voltage control module comprises: a third MOS transistor (MN3) having a source coupled to the drain of the second MOS transistor; a fourth MOS transistor (MN1) having a source coupled to a gate of the third MOS transistor, a fifth MOS transistor (MN6) having a gate coupled to the gate of the fourth MOS transistor and a source coupled to a gate of the second MOS transistor, and a sixth MOS transistor (MN2) having a drain and a gate both coupled to the source of the fourth MOS transistor, wherein the second, the third, the fourth, the fifth and the sixth MOS transistors have the same layout.

This embodiment provides a specific embodiment for the voltage control module.

In a further preferred embodiment, the current source further comprises: a first capacitor filter (CF1), coupled between the gate of the fifth MOS transistor (MN6) and the source of the second MOS transistor (MN4).

In this embodiment, the first capacitor filter can prevent the current oscillation issue.

In a preferred embodiment, oscillator module further comprises: an eighth MOS transistor, having a gate, a source coupled to the reference voltage, and a drain coupled to a second trigger node of the oscillator module, for generating the oscillating output signal of the oscillator module by being alternately turned on and off, the eighth MOS transistor having the same layout as the first MOS transistor, and a second capacitor, coupled between the gate and the source of the eighth MOS transistor, and configured to be alternately charged or discharged in response to the oscillating output signal to turn the eighth MOS transistor on and off; wherein the oscillator module alternately charges the first and the second capacitors thereby alternately turning on the first and the eighth MOS transistors; and wherein the current source configured to control a current flowing through the eighth MOS transistor so that a voltage between the drain and the source of the eighth MOS transistor is no greater than a first value when the eighth MOS transistor is turned on.

This embodiment implements the oscillator module by using an astable multivibrator.

In another aspect, there is provided a method, comprising the steps of: coupling a trigger input to a reference voltage via a drain and a source of a first MOS transistor, by turning on and off the first MOS transistor; and controlling a current flowing through the first MOS transistor so that a voltage between a drain and a source of the first MOS transistor is no greater than a first value when the first MOS transistor is turned on.

In this aspect, the current flowing through the first MOS transistor is controlled to enable that the voltage between the drain and the source of the first MOS transistor is no greater than a first value, therefore the voltage to the first trigger node can be controlled despite of the varied working conditions.

In an embodiment, a circuit comprises: a first transistor having a drain terminal biased by a first bias current and configured to generate a first oscillating signal; a first capacitor coupled between a gate terminal of the first transistor and a source terminal of the first transistor; a third transistor having a gate terminal responsive to a first logic state of the first oscillating signal and configured to charge said first capacitor; a fourth transistor having a gate terminal responsive to a second logic state of the first oscillating signal and configured to discharge said first capacitor; a fifth transistor having a same layout as said first transistor; a resistor coupled between a gate terminal of the fifth transistor and a source terminal of the fifth transistor; and a current mirror circuit having an input coupled to receive a reference current passing through the resistor and having a first output configured to generate the first bias current.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 8 shows the frequency variation versus temperature of the circuit in FIG. 5; and FIG. 9 shows the frequency variation of Monte Carlo analysis of the circuit in FIG. 5.

Corresponding numerals and symbols in different figures generally refer to corresponding parts unless otherwise indicated. The figures are drawn to clearly illustrate the relevant aspects of embodiments of the present disclosure and are not necessarily drawn to scale. To illustrate certain embodiments more clearly, a letter indicating variations of the same structure, material, or process step may follow a figure number.

DETAILED DESCRIPTION OF THE DRAWINGS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

An oscillating circuit is proposed which comprises:

an oscillator module, comprising: a first MOS transistor, having a gate, a source coupled to a reference voltage, and a drain coupled to a first trigger node of the oscillator module, for generating the oscillating output signal of the oscillator module by being alternately turned on and off, and a first capacitor, coupled between the gate and the source of the first MOS transistor, and configured to be alternately charged or discharged in response to the oscillating output signal to turn the first MOS transistor on and off, and a current source, configured to control a current flowing through the first MOS transistor so that a voltage between the drain and the source of the first MOS transistor is no greater than a first value when the first MOS transistor is turned on.

A method of generating an oscillating signals is proposed which comprises the steps of: coupling a trigger input to a reference voltage via a drain and a source of a first MOS transistor, by turning on and off the first MOS transistor; and controlling a current flowing through the first MOS transistor so that a voltage between a drain and a source of the first MOS transistor is no greater than a first value when the first MOS transistor is turned on.

Figure 1:
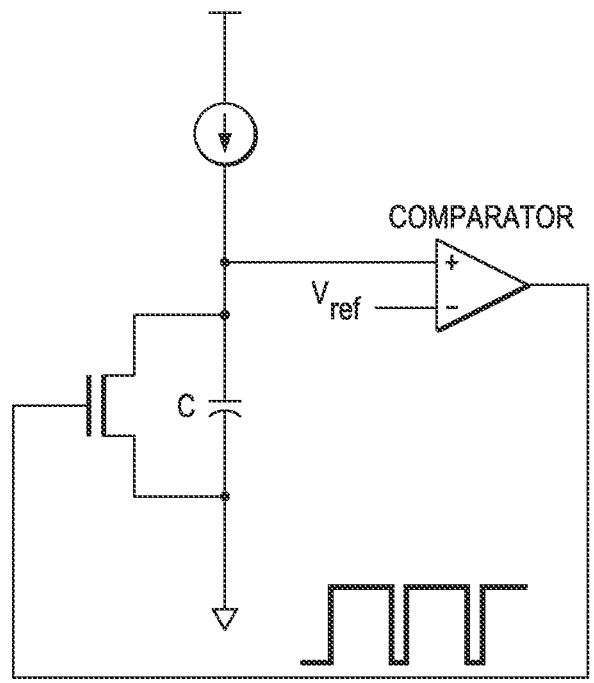
FIGS. 1 to 4 respectively show a conventional types of oscillators.
Figure 2:
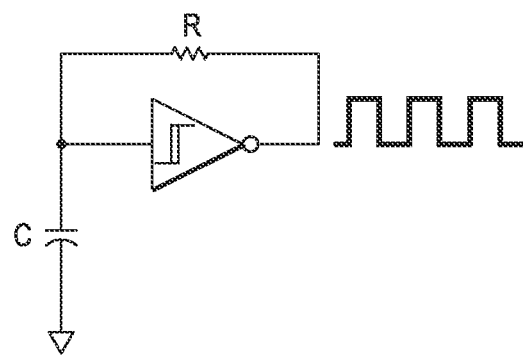
Figure 3:
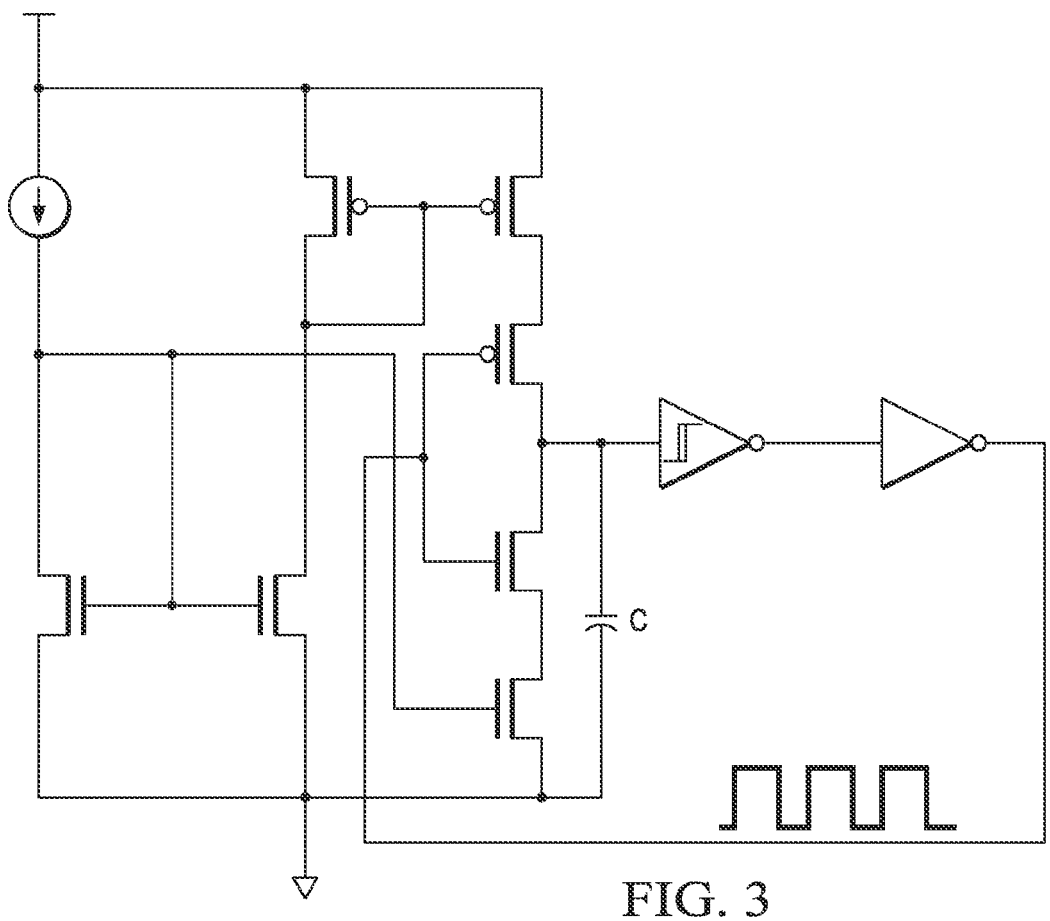
Figure 4:
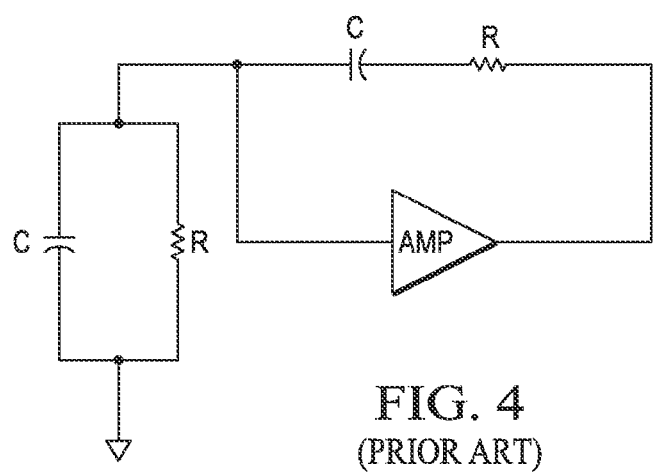
Figure 5:
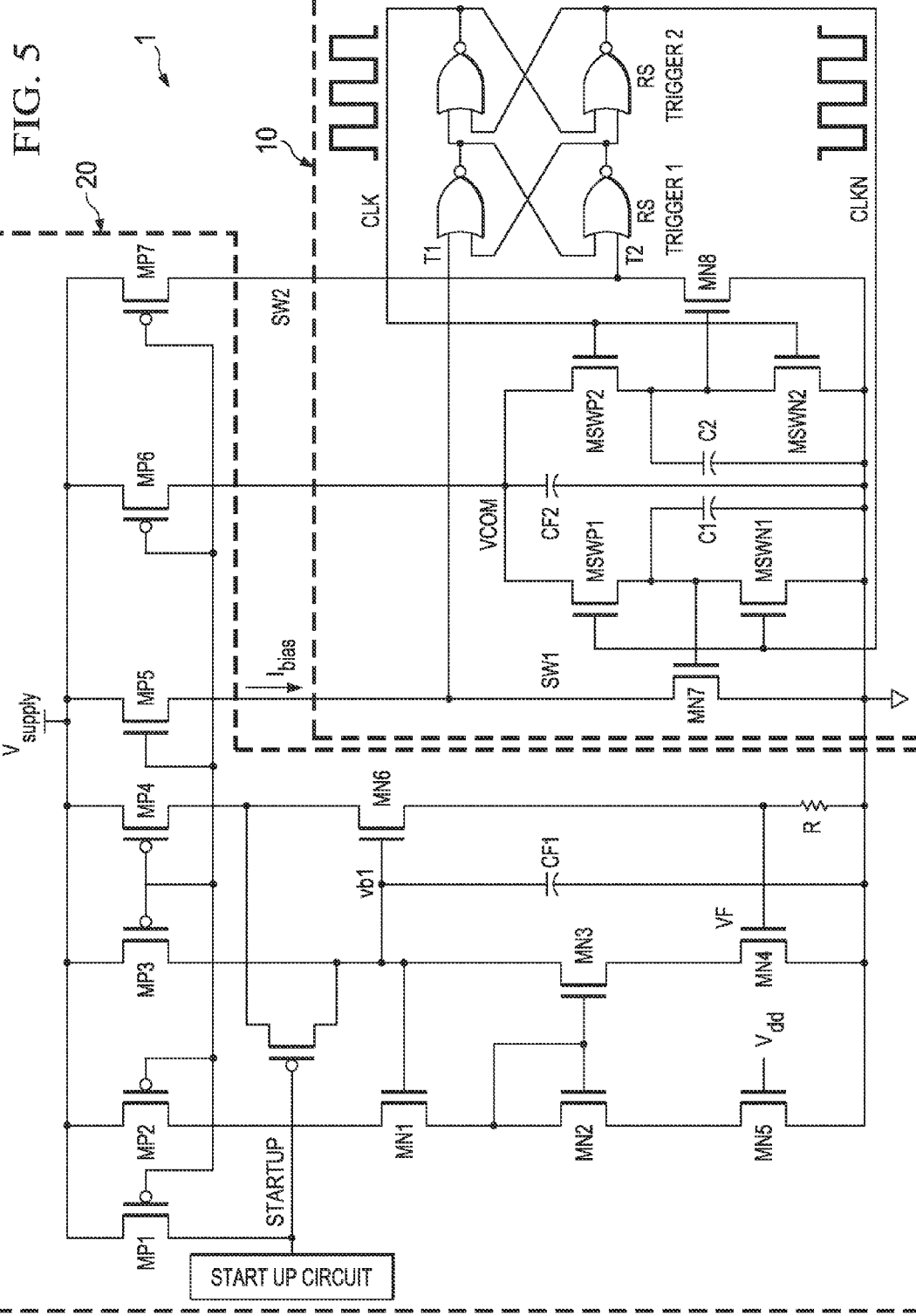
FIG. 5 shows a circuit according to a preferred embodiment including an oscillator module and the current source.

FIG. 5 shows a circuit 1 according to a preferred embodiment which includes an oscillator module 10 and the current source 20. As shown in FIG. 5, the oscillator module 10 comprises a first MOS transistor MN7 and a first capacitor C1. The first MOS transistor MN7 has a source coupled to a reference voltage, for example the ground, and generates, via a drain of the first MOS transistor MN7, an oscillating output signal of the oscillator module by being alternately turned on and off by the first capacitor C1. The drain is coupled to a first trigger node T1 of the oscillator module for shaping the oscillating output signal. The first capacitor C1 is coupled between the gate and the source of the first MOS transistor MN7, and configured to be alternately charged or discharged in response to the shaped oscillating output signal, so as to turn the first MOS transistor on and off. In one embodiment as shown in FIG. 5, a specific circuit for charging and discharging the first capacitor C1 according to the shaped oscillating output signal comprises a switch MswN1 and a switch MswP1. The switch MswN1 is coupled in parallel with the first capacitor C1, and the switch MswP1 is coupled in series with the first capacitor C1 and the current source 20 for charging first capacitor C1. The oscillating output signal controls the on and off of the two switches MswN1 and MswP1: when the oscillating output signal is low level, MswP1 is on and MswN1 is off, the current source charges the first capacitor C1; and when the oscillating output signal is high level, MswP1 is off and MswN1 is on, the first capacitor C1 is discharged. Those skilled in the art would understand that the circuit for charging and discharging a capacitor according to an oscillating signal has various implementations, and the invention is not limited to the illustrated embodiment.

In this embodiment, besides the left oscillating side comprising the first MOS transistor MN7 and the first capacitor C1, the oscillator module 10 further comprises a symmetrical right oscillating side comprising an eighth MOS transistor MN8 and a second capacitor C2. Specifically, the eighth MOS transistor MN8 has a source coupled to the reference voltage, for example the ground, and generates, via a drain of the eighth MOS transistor MN8, an oscillating output signal of the oscillator module by being alternately turned on and off by the second capacitor C2. The drain is coupled to a second trigger node T2 of the oscillator module for shaping the oscillating output signal. The second capacitor C2 is coupled between the gate and the source of the eighth MOS transistor MN8, and configured to be alternately charged or discharged in response to the oscillating output signal to turn the eighth MOS transistor MN8 on and off. As to the specific circuit for charging and discharging the second capacitor C2, in the embodiment of FIG. 5, one switch MswN2 is coupled in parallel with the second capacitor C2, and one switch MswP2 is coupled in series with the second capacitor C2 with a current source 20 for charging the second capacitor C2. The oscillating output signal controls the on and off of the two switches MswN2 and MswP2, thus controls the charging and discharging of the second capacitor C2.

The oscillator module 10 in FIG. 5 has two sides of oscillating and can be considered as a type of astable multivabrator. It should be understood that the oscillator module 10 is not limited by this embodiment, and in varied embodiments of the oscillator module, the right oscillating side constituted by the eighth MOS transistor MN8 and the second capacitor C2 can be spared. Those skilled in the art would implement the oscillator module in other layout, and all these implementations are covered by the claims would fall into the scope of the oscillator module of the claims. The operation of the right oscillating side is similar as that of the left oscillating side, and the following elucidation will mainly focus on the operation of the left oscillating side.

When generating the oscillating signal, the first MOS transistor MN7 would be switched on and off. When switched on, in order to make the trigger such as the RS trigger 1 as shown in FIG. 5 to flip over so as to generate a triggered oscillating signal, the voltage at the first trigger node T1, namely the voltage at the drain of the first MOS transistor MN7 should be a certain voltage close to the reference voltage. Therefore, when the first MOS transistor is switched on, a voltage $V_{DS}$ between the drain and the source of the first MOS transistor should be no greater than a first value. Under different working conditions such as different temperatures, the physical features of the first MOS transistor change, and it is probable that the first transistor needs different current to make $V_{DS}$ no greater than the first value. Therefore, to make $V_{DS}$ no greater than the first value under all circumstance, the current flowing through the first MOS transistor needs to be controlled.

The current source 20 is configured to control a current $I_{bias}$ flowing through the first MOS transistor MN7 so that the voltage $V_{DS}$ between the drain and the source of the first MOS transistor MN7 is no greater than the first value when the first MOS transistor MN7 is turned on.

In one embodiment, a second MOS transistor is provided which has the same layout as the first MOS transistor. Since the second MOS transistor has the same layout as the first MOS transistor MN7, despite of the varied working conditions and semi-conductor process, the second MOS transistor is the same as the first MOS transistor MN7. By controlling the current flowing through the second MOS transistor so that a voltage $V_{DS}$ between the drain and the source of the second MOS transistor is no greater than the first value, the same current would follow the need of the first MOS transistor to make the $V_{DS}$ of the first MOS transistor MN7 no greater than the first value.

Based on the foregoing, the current source 20 comprises:
a second MOS transistor MN4, having the same layout as the first MOS transistor MN7,
a voltage control module, configured to control a voltage between a drain and a source of the second MOS transistor MN4 to be no greater than the first value when the second MOS transistor MN4 is turned on, and
a current mirror having a resistor R coupled between a gate and the source of the second MOS transistor MN4, wherein the current mirror dumps the current $I_{bias}$, which is the same as a current flowing through the resistor, through the first MOS transistor MN7.

As to the method, the step of controlling comprises the steps of:
controlling a voltage between a drain and a source of a second MOS transistor so that the voltage is no greater than the first value, the second MOS transistor having the same layout as the first MOS transistor,
coupling a resistor between a gate and the source of the second MOS transistor, and
dumping a current, which is the same as a current flowing through the resistor, through the first MOS transistor.

Figure 6:
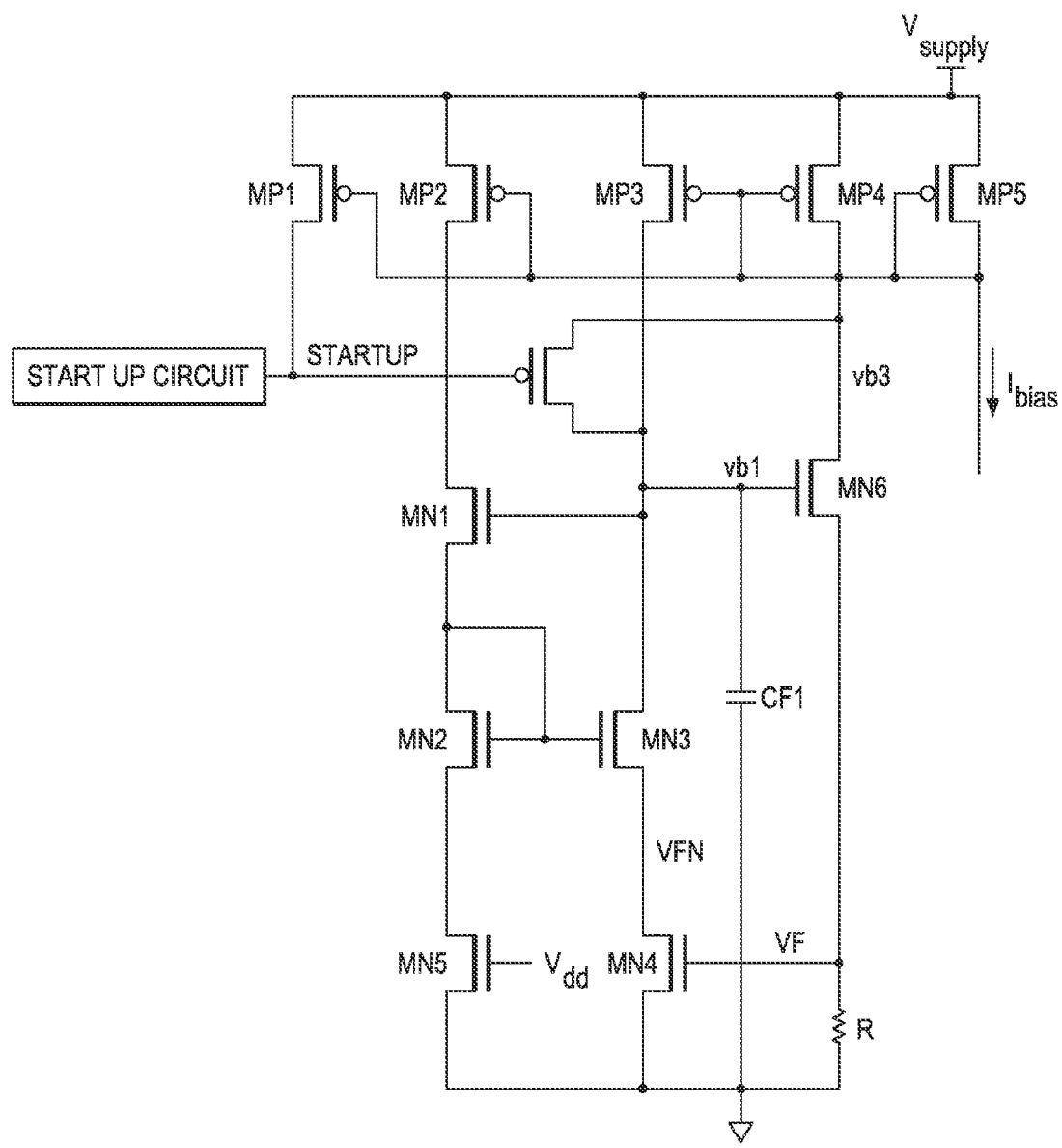
FIG. 6 shows in detail the current source in FIG. 5.

FIG. 5 and FIG. 6 show the circuitry structure of the current source 20 with its voltage control module and current mirror. The voltage control module comprises: a third MOS transistor MN3 having a source coupled to the drain of the second MOS transistor MN4, a fourth MOS transistor MN1 having a source coupled to a gate of the third MOS transistor MN3, a fifth MOS transistor MN6 having a gate coupled to the gate of the fourth MOS transistor MN1 and the drain of the third MOS transistor, and a source coupled to a gate of the second MOS transistor MN4, a sixth MOS transistor MN2 having a drain and a gate both coupled to the source of the fourth MOS transistor MN1, and a seventh MOS transistor MN5 having a drain coupled to a source of the sixth MOS transistor MN2 and a source coupled to the source of the second MOS transistor MN4.

The second, the third, the fourth, the fifth, the sixth and the seventh MOS transistors have the same layout.

The current mirror dumps the same current through the third MOS transistor MN3, the fourth MOS transistor MN1 and the fifth MOS transistor MN6. The current mirror comprises a plurality of transistors MP1-7, a drain of each transistor coupled to a common voltage source, gates of the transistors are coupled together, and a source of each transistor respectively dumps the same current respectively to the third MOS transistor MN3, the fourth MOS transistor MN1 and the fifth MOS transistor (MN6), as well as the first MOS transistor MN7, the eighth MOS transistor MN8, and the first capacitor C1 and the second capacitor C2 for charging the capacitors. Those skilled in the art understand that there are other implementations for the current mirror.

During an operation of the voltage control module, the transistors MN1-MN6 are on and they are all operating with same current. The voltage Vds between the drain and the source of the second MOS transistor MN4 is decided by:

$$Vb1-Vgs1-Vgs3$$

wherein Vb1 is the voltage at the gate of the MN1, Vgs1 is the voltage between the gate and the source of the MN1, and Vgs3 is the voltage between the gate and the source of the MN3.

Furthermore, Vb1=VF+Vgs6, wherein VF is the voltage at the source of the MN6 and also a gate voltage switching the second MOS transistor MN4 on, the Vgs6 is the voltage between the gate and the source of the MN6.

Therefore, Vds4 is close to zero since the MOS transistors MN1 to MN6 have almost the same Vgs due to that the current flowing through each of them is the same.

The voltage control module as shown in FIGS. 5 and 6 are arranged to control the Vds of the second MOS transistor MN4 close to zero, therefore the same current flowing through the first MOS transistor MN7 would make the Vds of the first MOS transistor MN7 close to zero, thereby making the trigger to flip over. It should be understood that the circuit of the voltage control module in FIGS. 5 and 6 are just an example, and those skilled in the art would design other circuit of the voltage control module to control the Vds of the second MOS transistor MN4. Additionally, dependent on different flip-over threshold voltage of the trigger, the Vds of the first MOS transistor MN7 as well as the Vds of the second MOS transistor MN4 for the flipping over may change, and the voltage control module would be designed to provide the corresponding Vds of the second MOS transistor MN4.

The amplitude of the current is VF/r wherein r is the resistance of the resistor R, and a current with the same amplitude is used for charging the first capacitor C1. When the voltage between the first capacitor reaches VF, the first MOS transistor MN7 is switched. Therefore, the frequency of the oscillator module should be 1/(VF*c/(VF/r))=1/(r*c), wherein c is the capacity of the first capacitor C1. That is, the frequency of the oscillator module 10 depends on the resistance of the resistor and the capacity of the first capacitor C1, thus the oscillator module is easy to be trimmed by adjusting the resistance of the resistor and is not affected by parasitic parameters.

Preferably, a first capacitor filter CF1 is coupled between the gate of the fifth MOS transistor MN6 and the source of the second MOS transistor MN4. The first capacitor filter CF1 can prevent the current oscillation issue. Also, preferably, a second capacitor filter CF2 is arranged in parallel with the left oscillating side and the right oscillating side to filter the common node for a better switching stability.

The current $I_{bias}$ for the oscillator module 10 can be calculated as follows:

$$\begin{cases} I_{bias} = 0.5uC_{ox}\frac{W}{L}(V_{gs2} - V_{th})^2 \\ I_{bias} = 0.5uC_{ox}\frac{W}{L}(I_{bias} * R - V_{th})V_{ds4} \\ I_{bias} = 0.5uC_{ox}\frac{W}{L}(V_{gs2} - V_{th} - V_{ds4})^2 \end{cases}$$

$$\rightarrow I_{bias} = \left[0, \frac{V_{th}}{R} + \frac{0.25L}{RuC_{ox}W}\left(1 + \sqrt{1 + \frac{8RuC_{ox}V_{th}W}{L}}\right), \right.$$

$$\left. \frac{V_{th}}{R} - \frac{0.25L}{RuC_{ox}W}\left(-1 + \sqrt{1 + \frac{8RuC_{ox}V_{th}W}{L}}\right)\right]$$

$$\rightarrow Ibias = \frac{V_{th}}{R} + \frac{0.25L}{RuC_{ox}W}\left(1 + \sqrt{1 + \frac{8RuC_{ox}V_{th}W}{L}}\right)$$

To get an expected performance of the oscillator module, adjusting the switching threshold voltage of the trigger to be a related high level helps to increase the oscillation stability accordingly. In the embodiment as shown in FIG. 5, two cascaded RS trigger1 and RS trigger2 are provided. Those skilled in the art should understand that other arrangements of the triggers are also possible.

Figure 7:
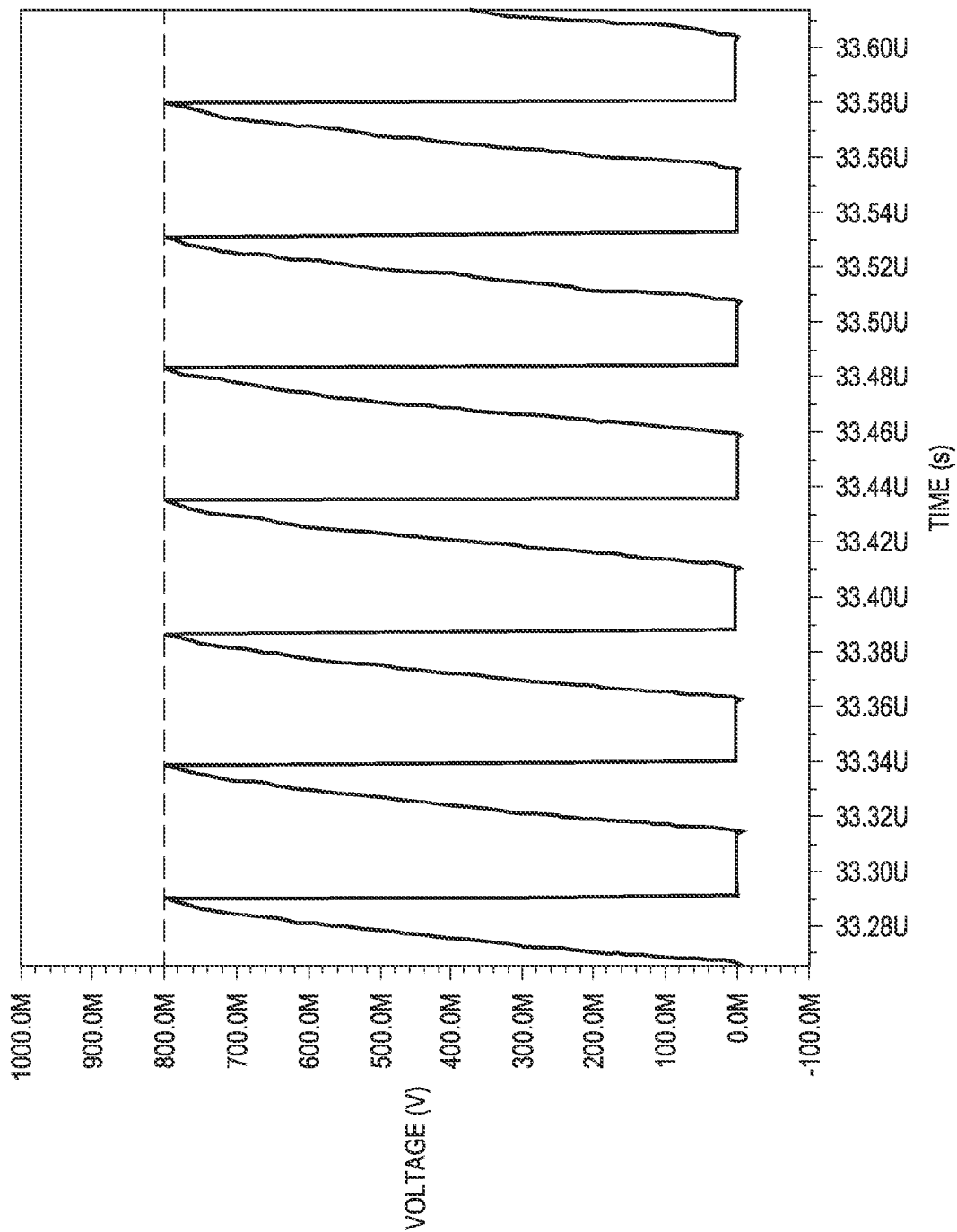
FIG. 7 shows the switching behavior of the first MOS transistor of in the oscillator module of the circuit in FIG. 5.

FIGS. 7-9 illustrate the results of simulations on the proposed circuit in FIG. 5. The simulation is in a condition of 0.18μ, CMOS process.

FIG. 7 shows the switching behavior of the first MOS transistor of the circuit in FIG. 5. In FIG. 7, the horizontal line stands for the voltage at the gate of the second MOS transistor MN4, namely VF. The curve stands for the voltage at the gate of the first MOS transistor MN7, and reflects the charging and discharging of the first capacitor C1.

FIG. 8 shows the frequency variation versus temperature of the circuit in FIG. 5. It can be seen that across a very wide rage of temperature, the frequency is within a ±1% variation, and thus the proposed circuit is quite stable under the wide rage of temperature.

FIG. 9 shows the frequency variation of Monte Carlo analysis of the circuit in FIG. 5.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
   an oscillator module, comprising:
      a first MOS transistor having a gate, a source coupled to a reference voltage, and a drain coupled to a first trigger node of the oscillator module, the first transistor configured to generate an oscillating output signal of the oscillator module by being alternately turned on and off, and
      a first capacitor coupled between the gate and the source of the first MOS transistor and configured to be alternately charged or discharged in response to the oscillating output signal to turn the first MOS transistor on and off, and
      a current source configured to control a current flowing through the first MOS transistor so that a voltage between the drain and the source of the first MOS transistor is no greater than a first value when the first MOS transistor is turned on;
   wherein the current source comprises:
      a second MOS transistor having a same layout as the first MOS transistor,
      a voltage control module configured to control a voltage between a drain and a source of the second MOS transistor to be no greater than the first value when the second MOS transistor is on, and
      a current mirror having a resistor coupled between a gate and the source of the second MOS transistor, wherein the current mirror supplies a current through the first MOS transistor which is the same as a current flowing through the resistor.

2. The circuit as claimed in claim 1, wherein the voltage control module comprises:
   a third MOS transistor having a source coupled to the drain of the second MOS transistor,
   a fourth MOS transistor having a source coupled to a gate of the third MOS transistor,
   a fifth MOS transistor having a gate coupled to the gate of the fourth MOS transistor and a drain of the third MOS transistor, and a source coupled to a gate of the second MOS transistor, and
   a sixth MOS transistor having a drain and a gate both coupled to the source of the fourth MOS transistor,
   wherein the second, the third, the fourth, the fifth and the sixth MOS transistors have the same layout, and
   wherein the current mirror sources the same current through the third MOS transistor, the fourth MOS transistor and the fifth MOS transistor.

3. The circuit as claimed in claim 2, wherein the voltage control module further comprises:

a seventh MOS transistor having a drain coupled to a source of the sixth MOS transistor and a source coupled to the source of the second MOS transistor, wherein the seventh MOS transistors has the same layout as the second MOS transistor.

4. The circuit as claimed in claim 2, wherein the current source further comprises: a first capacitor filter coupled between the gate of the fifth MOS transistor and the source of the second MOS transistor.

5. The circuit as claimed in claim 1, wherein the oscillator module further comprises:

an eighth MOS transistor having a gate, a source coupled to the reference voltage, and a drain coupled to a second trigger node of the oscillator module, the eighth MOS transistor configured to generate the oscillating output signal of the oscillator module by being alternately turned on and off, the eighth MOS transistor having the same layout as the first MOS transistor, and a second capacitor coupled between the gate and the source of the eighth MOS transistor and configured to be alternately charged or discharged in response to the oscillating output signal to turn the eighth MOS transistor on and off;

wherein the oscillator module alternately charges the first and the second capacitors thereby alternately turning on the first and the eighth MOS transistors; and wherein the current source is configured to control a current flowing through the eighth MOS transistor so that a voltage between the drain and the source of the eighth MOS transistor is no greater than a first value when the eighth MOS transistor is turned on.

6. The circuit as claimed in claim 1, wherein the current mirror supplies a current to charge the first capacitor which is the same as a current flowing through the resistor.

7. A method, comprising:

coupling a trigger input to a reference voltage via a drain and a source of a first MOS transistor by turning on and off the first MOS transistor; and controlling a current flowing through the first MOS transistor so that a voltage between a drain and a source of the first MOS transistor is no greater than a first value when the first MOS transistor is turned on by:

controlling a voltage between a drain and a source of a second MOS transistor so that the voltage is no greater than the first value, the second MOS transistor having a same layout as the first MOS transistor, coupling a resistor between a gate and the source of the second MOS transistor, and supplying a current through the first MOS transistor which is the same as a current flowing through the resistor.

8. The method as claimed in claim 7, wherein turning on the first MOS transistor comprises:

supplying a current to charge a capacitor coupled between the gate and the source of the first MOS transistor for turning on the first MOS transistor which is the same as a current flowing through the resistor.

9. A circuit, comprising:

a first transistor having a drain terminal biased by a first bias current and configured to generate a first oscillating signal;

a first capacitor coupled between a gate terminal of the first transistor and a source terminal of the first transistor;

a third transistor having a gate terminal responsive to a first logic state of the first oscillating signal and configured to charge said first capacitor;

a fourth transistor having a gate terminal responsive to a second logic state of the first oscillating signal and configured to discharge said first capacitor;

a fifth transistor having a same layout as said first transistor;

a resistor coupled between a gate terminal of the fifth transistor and a source terminal of the fifth transistor; and a current mirror circuit having an input coupled to receive a reference current passing through the resistor and having a first output configured to generate the first bias current.

10. The circuit of claim 9, further comprising a trigger circuit configured to receive the first oscillating signal and generate a first control signal for application to the gate terminals of the second and third transistors.

11. The circuit of claim 9, wherein the current mirror further has a second output configured to generate a second bias current which passes through said fifth transistor.

12. The circuit of claim 11, wherein the first and second bias currents are equal.

13. The circuit of claim 11, wherein the current mirror further has a third output configured to generate a third bias current configured to provide charge for charging said capacitor through the third transistor.

14. The circuit of claim 13, further comprising a second capacitor coupled to the third transistor and configured to receive said third bias current.

* * * * *